United States Patent
Hung et al.

(10) Patent No.: US 7,539,049 B2
(45) Date of Patent: May 26, 2009

(54) MAGNETIC RANDOM ACCESS MEMORY AND OPERATION METHOD

(75) Inventors: Chien-Chung Hung, Taipei (TW); Ming-Jer Kao, Hsinchu County (TW); Ding-Yeong Wang, Hsinchu County (TW); Yuan-Jen Lee, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 15 days.

(21) Appl. No.: 11/946,025

(22) Filed: Nov. 27, 2007

(65) Prior Publication Data

US 2009/0034322 A1    Feb. 5, 2009

(30) Foreign Application Priority Data

Aug. 2, 2007    (TW) .............................. 96128409 A

(51) Int. Cl.
*G11C 11/00* (2006.01)
(52) U.S. Cl. .................. 365/158; 365/171; 977/935
(58) Field of Classification Search ................ 365/171, 365/173, 158, 131, 66; 257/421, E21.665; 438/3; 977/933, 934, 935
See application file for complete search history.

(56) References Cited

U.S. PATENT DOCUMENTS

| 6,421,271 | B1 | 7/2002 | Gogl et al. |
| 2004/0012994 | A1 * | 1/2004 | Slaughter et al. ............ 365/158 |

\* cited by examiner

*Primary Examiner*—Richard Elms
*Assistant Examiner*—Harry W Byrne
(74) *Attorney, Agent, or Firm*—Jianq Chyun IP Office

(57) ABSTRACT

A magnetic random access memory includes at least a first-direction write current line and multiple second-direction write current line, intersecting with the first-direction write current line in substantial perpendicular and forming several intersecting regions. Multiple magnetic memory cells are respectively located at the intersecting regions for receiving an induced magnetic field in a time sequence. Every at least two adjacent memory cells are in parallel or series connection, to form at least one memory unit. An easy axis of a free layer of each magnetic memory cell is substantially perpendicular to a magnetization of a pinned layer. The easy axis and the first-direction write current line form an including angle of about 45°. A read bit-line circuit connects to a first terminal of the memory unit. A read word-line circuit connects to a second terminal of the memory unit.

20 Claims, 10 Drawing Sheets

MAGNETIC RANDOM ACCESS MEMORY AND OPERATION METHOD

CROSS-REFERENCE TO RELATED APPLICATION

This application claims the priority benefit of Taiwan application serial no. 96128409, filed on Aug. 2, 2007. The entirety of the above-mentioned patent application is hereby incorporated by reference herein and made a part of this specification.

BACKGROUND OF THE INVENTION

1. Field of the Invention

The present invention relates to a memory, more specifically, relates to magnetic random access memory (MRAM).

2. Description of Related Art

Magnetic memory, for example, magnetic random access memory (MRAM), is a non-volatile memory with the advantages of non-volatility, high density, high read and write speed, and anti-radiation. When writing data, the commonly used method is that: a cell unit is selected by the intersection of the induced magnetic fields of two current lines (Write Bit Line and Write Word Line). The magnetoresistance value of the magnetic memory cell is changed by changing the magnetization direction of the magnetic material in the memory layer. When reading stored data, a sense amplifier provides a current to the selected magnetic memory cell unit, and the resistance value of the magnetic memory cell unit is read to determine the digital value of the stored data.

The magnetic memory cell unit is a stacking structure of a plurality of layers of magnetic metal material. The structure thereof is a stack of soft magnetic layer, tunneling barrier layer, hard magnetic layer and nonmagnetic conductive layer. Through the magnetization directions of the ferromagnetic materials on the two sides of the tunneling barrier layer being parallel or anti-parallel to determine storing the state of "1" or "0".

Figure 1:
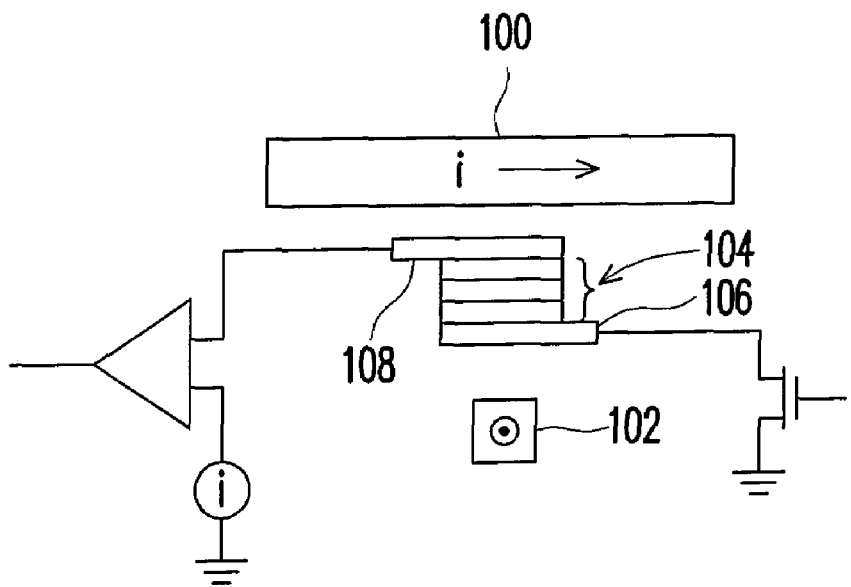

FIG. 1 schematically illustrates a basic structure of a magnetic memory cell. With reference to FIG. 1, to write into a magnetic memory cell, the current lines 100, 102 are also needed. The current lines 100, 102 intersect with each other, and an appropriate current is introduced to the current lines 100, 102. According to the operation method thereof, the current lines 100, 102 for example may also be called bit line and word line. When current is passed to the two lines, magnetic fields of two directions are generated, so as to obtain the needed magnetic field and direction to apply on a magnetic memory cell 104. The magnetic memory cell 104 is a stacking structure, including a magnetic pinned layer with a fixed magnetization, or total magnetic moment at a predetermined direction. The angle difference of magnetizations between the magnetic free layer and the magnetic pinned layer generates different quantity of magnetoresistance, which is used to read data. In addition, when writing data in, a write magnetic field may also be applied to determine the magnetization direction of the magnetic free layer. Through output electrodes 106, 108, the data stored in the memory cell can be read out. The operation detail of the magnetic memory may be known by those with ordinary skill in the arts, therefore will not be further addressed.

Figure 2:
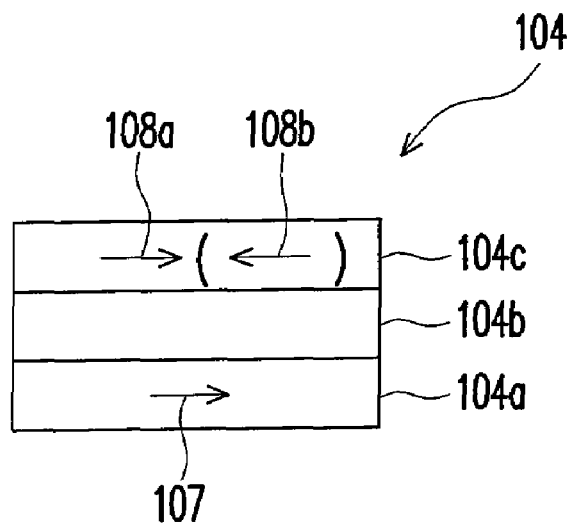

FIG. 2 schematically illustrates the mechanism of a magnetic memory. With reference to FIG. 2, the magnetic pinned layer 104a has the magnetic moment direction 107 with a fixed direction. The magnetic free layer 104c is above the magnetic pinned layer 104a, there is a tunneling barrier layer 104b in between for separation. The magnetic free layer 104c has a magnetic moment direction 108a or 108b. Since the magnetic moment direction 107 is parallel to the magnetic moment direction 108a, the generated magnetoresistance thereof for example represents the data of "0". On the contrary, the magnetic moment direction 107 is anti-parallel to the magnetic moment direction 108b, and the generated magnetoresistance thereof for example represents the data of "1".

The magnetic free layer 104c of above FIG. 2 is a single layer structure, and therefore data error is likely to occur in operation. U.S. Pat. No. 6,545,906 provided that in order to reduce the interference when the adjacent cell unit is written data, in the free layer, single layer ferromagnetic material is replaced by ferromagnetic/non-ferromagnetic/ferromagnetic three layers structure. The free layer is a synthetic anti-ferromagnetic structure, the top and bottom magnetic layers respectively have a magnetization. In order to reduce the interference when the adjacent cell unit is written data, the ferromagnetic layers of top and bottom layers are arranged in anti-parallel to form closed magnetic line of force. In addition, in association with toggle operation mode, the write bit line and the write word line has an including angle of 45 degrees with the magnetic easy axis of the free layer, and the provided currents are to be applied with a specific sequence. Such method can effectively solve the interference problem.

However, people with ordinary skill in the arts are still actively researching and developing magnetic memory design, and also expect to reduce the size of element and also increase the integration of elements in the same time.

SUMMERY OF THE INVENTION

The present invention provided a magnetic random access memory, while keeping fast access operation, the size of element can also be reduced, and the integration of elements is increased in the same time.

The present invention provides an operation method of a magnetic random access memory, so that the magnetic random access memory can be effectively accessed.

The present invention provides a magnetic random access memory, including at least a first-direction write current line and a plurality of second-direction write current lines which substantially perpendicular intersect with the first-direction write current line to form a plurality of intersection regions. Multiple magnetic memory cells are respectively located at the intersection regions and respectively receive an induced magnetic field in a time sequence. The adjacent every at least two magnetic memory cells are connected in series or parallel to form at least a memory unit. An easy axis of a free layer of each magnetic memory cell is substantially perpendicular to a magnetization of a pinned layer, and there is an angle of about 45 degree between the easy axis and the first-direction write current line. A read bit line circuit is connected to a first terminal of the memory unit. A read word line circuit is connected to a second terminal of the memory unit.

The present invention provides an operation method of a magnetic random access memory to operate the magnetic random access memory. The method includes applying a first current to the first-direction write current line, generating an induced magnetic field of a first stage; applying a second current to the second-direction write current line to generate an induced magnetic field of a second stage; reading a total magnetoresistance of the memory unit to determine a data stored in the memory unit.

The present invention also provides a magnetic random access memory circuit, including a plurality of first-direction write current lines, a plurality of second-direction write current lines which substantially perpendicular intersect with the first-direction write current lines to form a plurality of intersection regions. A plurality of magnetic memory cells are respectively located at the intersection regions, wherein the easy axis of the free layer of each magnetic memory cell is substantially perpendicular to a magnetization of the pinned layer thereof, and there is an including angle of about 45 degree between the easy axis and the first-direction write current line. The adjacent every at least two of these magnetic memory cells, which are driven by the same first-direction write current line, are a memory unit to form a plurality of memory columns. In addition, the circuit further includes a plurality of first switches, a plurality of sense amplifiers. These sense amplifiers are respectively connected to the memory unit of the memory column via the first switch. A plurality of second switches respectively connects the memory unit to a ground potential.

The present invention uses wiggle magnetic memory cell, and uses series or parallel connection method to reduce the size of memory cell element and can also increase the integration of elements.

In order to the make the aforementioned and other objects, features and advantages of the present invention comprehensible, a preferred embodiment accompanied with figures is described in detail below.

BRIEF DESCRIPTIONS OF DRAWINGS

FIG. 1 schematically illustrates a basic structure of a magnetic memory cell.

FIG. 2 schematically illustrates the storing mechanism of a magnetic memory.

Figure 3:
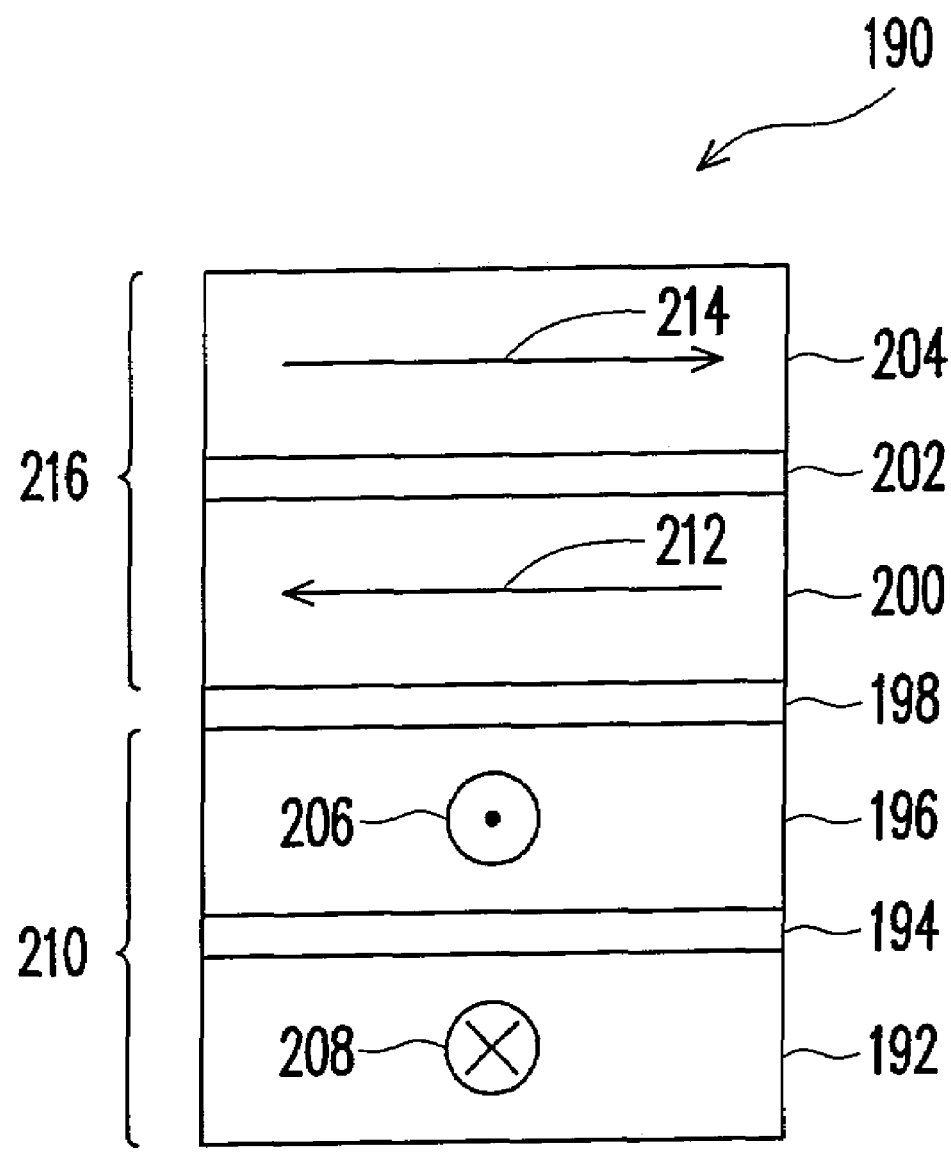

FIG. 3 schematically illustrates a structural diagram of a magnetic memory cell being used according to an embodiment of the present invention.

Figure 4:
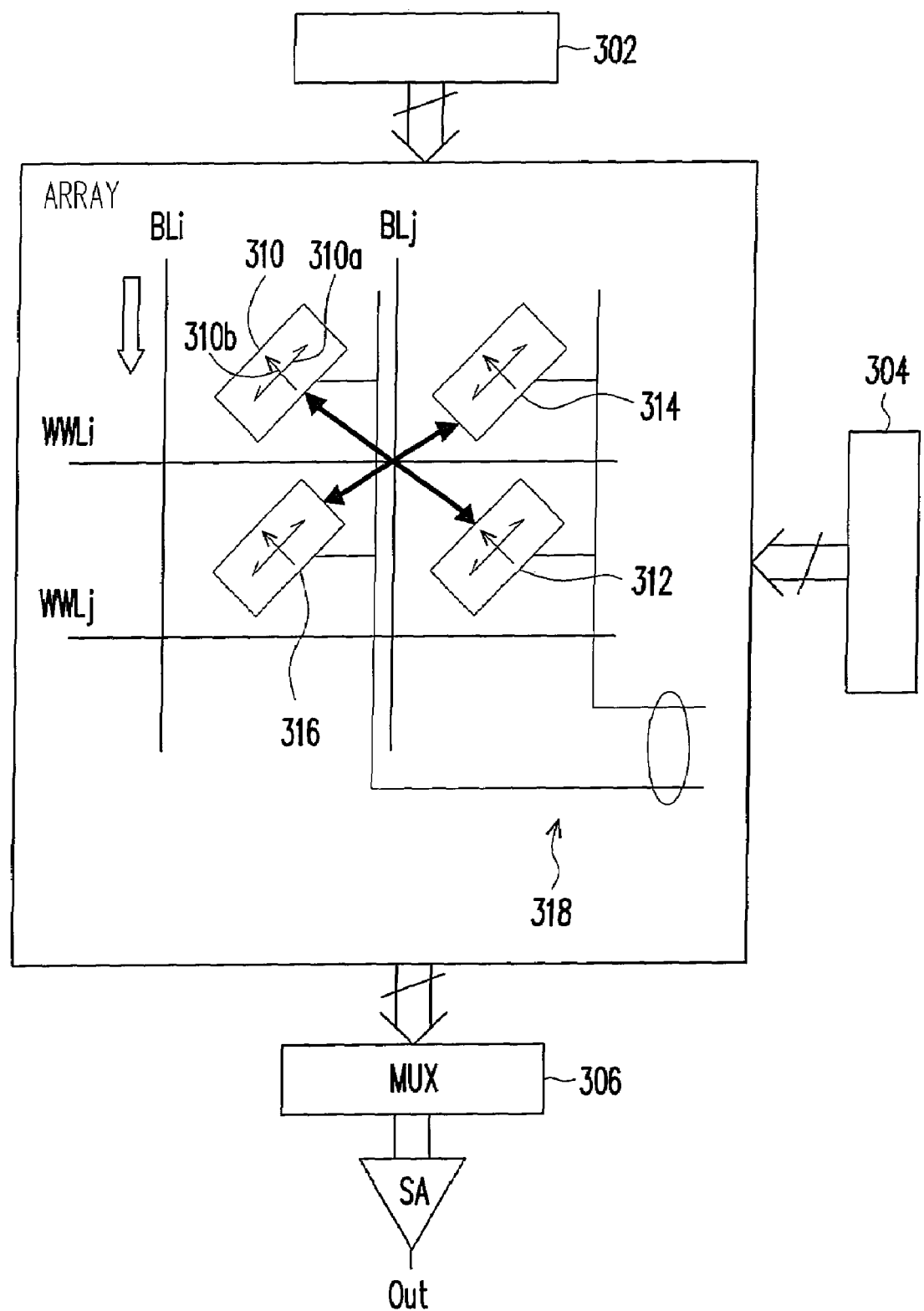

FIG. 4 schematically illustrates a circuit diagram of a general wiggle cell magnetic access memory being used in prior art.

Figure 5:
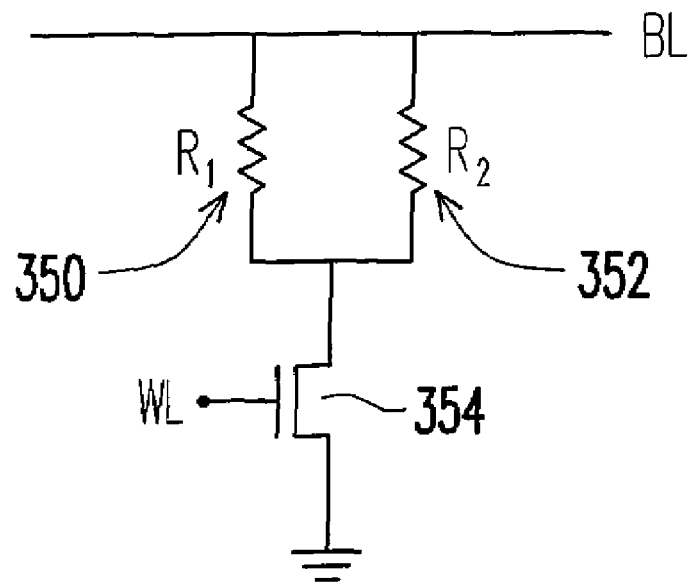
Figure 5:
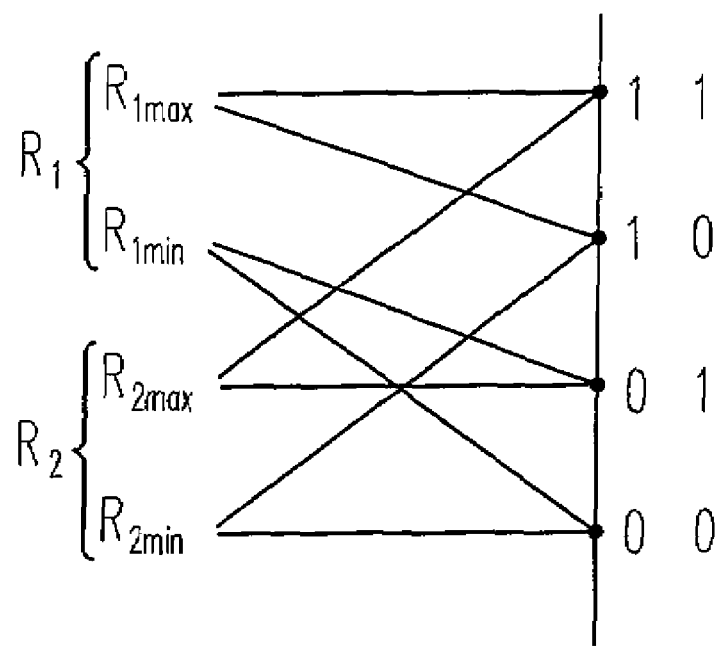

FIG. 5 schematically illustrates a diagram of a parallel circuit and memory mechanism being used in prior art.

Figure 6:
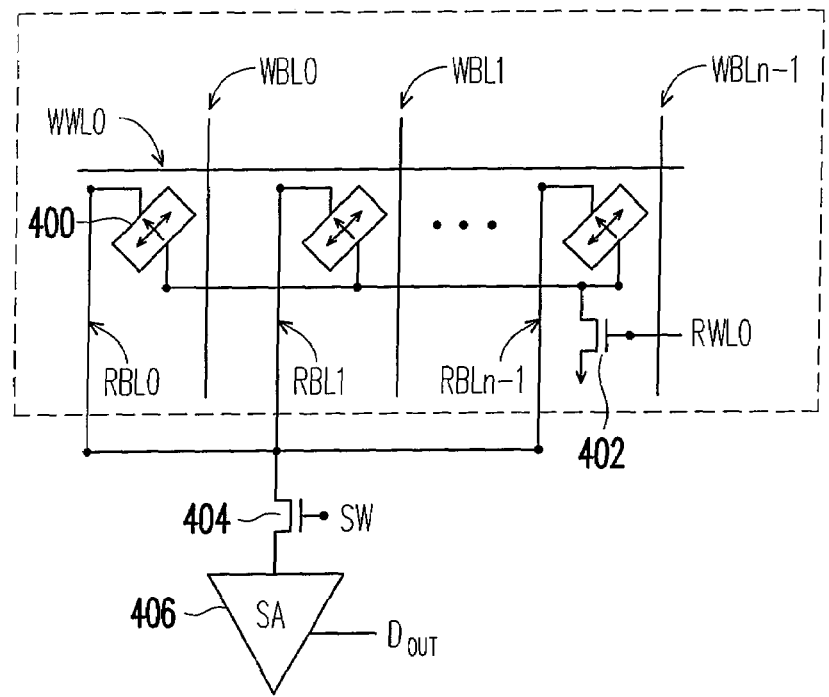

FIG. 6 schematically illustrates a diagram of a parallel circuit of a magnetic random access memory unit according to an embodiment of the present invention.

Figure 7:
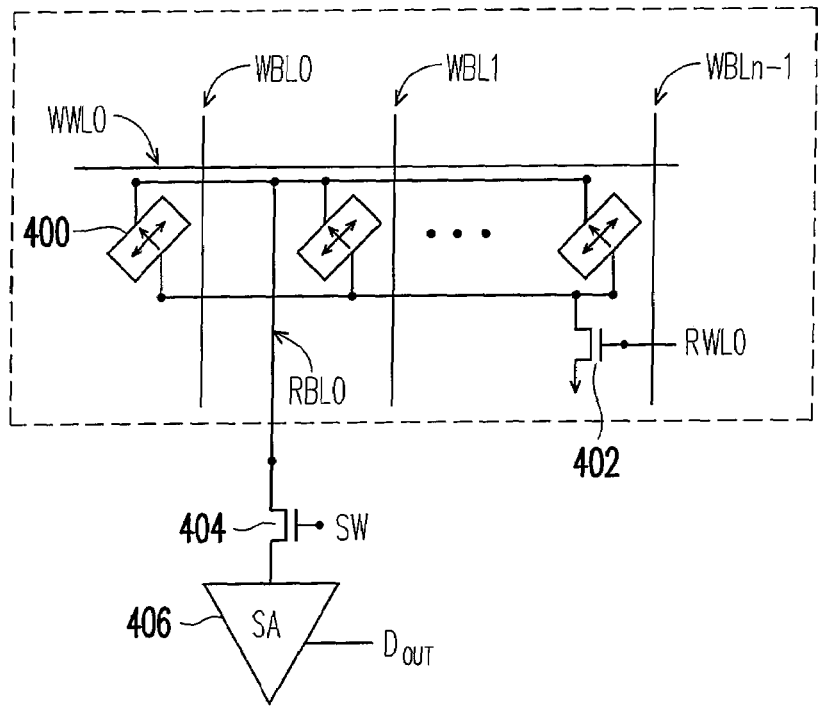

FIG. 7 schematically illustrates a diagram of a parallel circuit of a magnetic random access memory unit according to another embodiment of the present invention.

Figure 8:
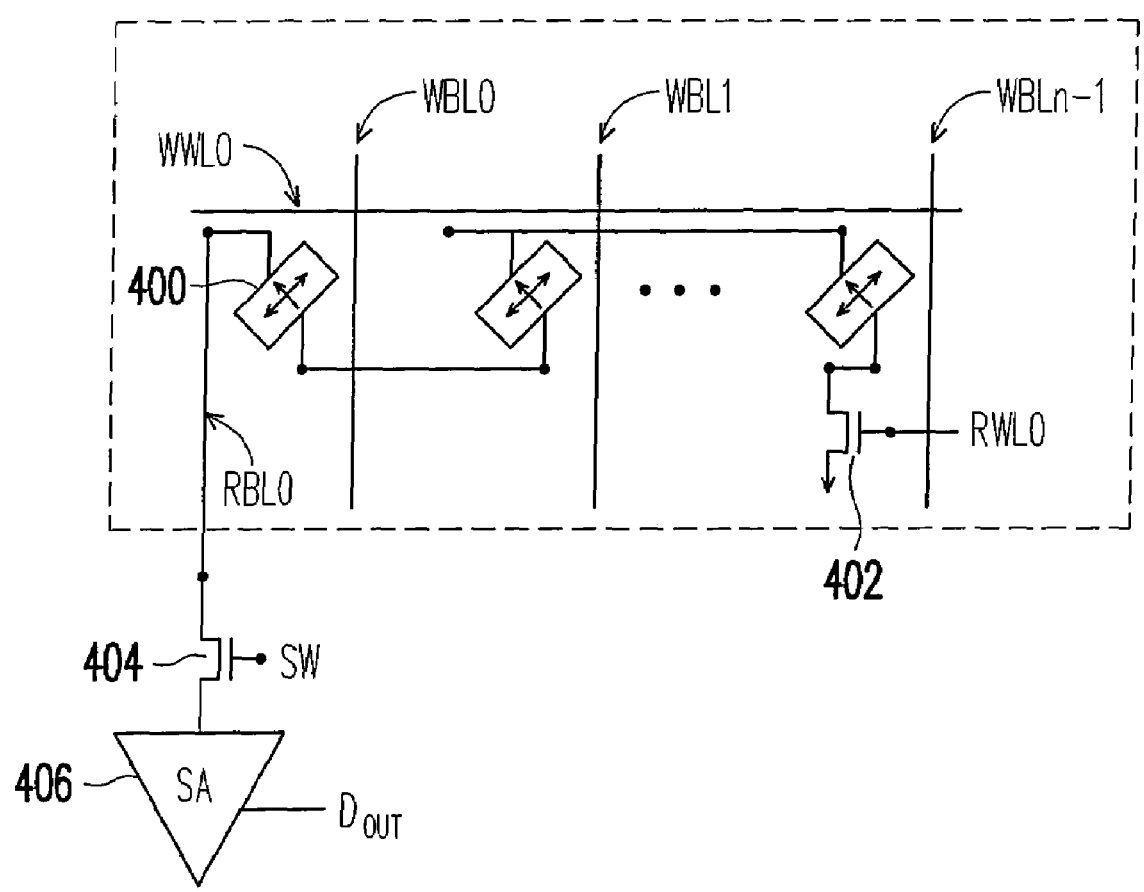

FIG. 8 schematically illustrates a diagram of a series circuit of a magnetic random access memory unit according to an embodiment of the present invention.

Figure 9:
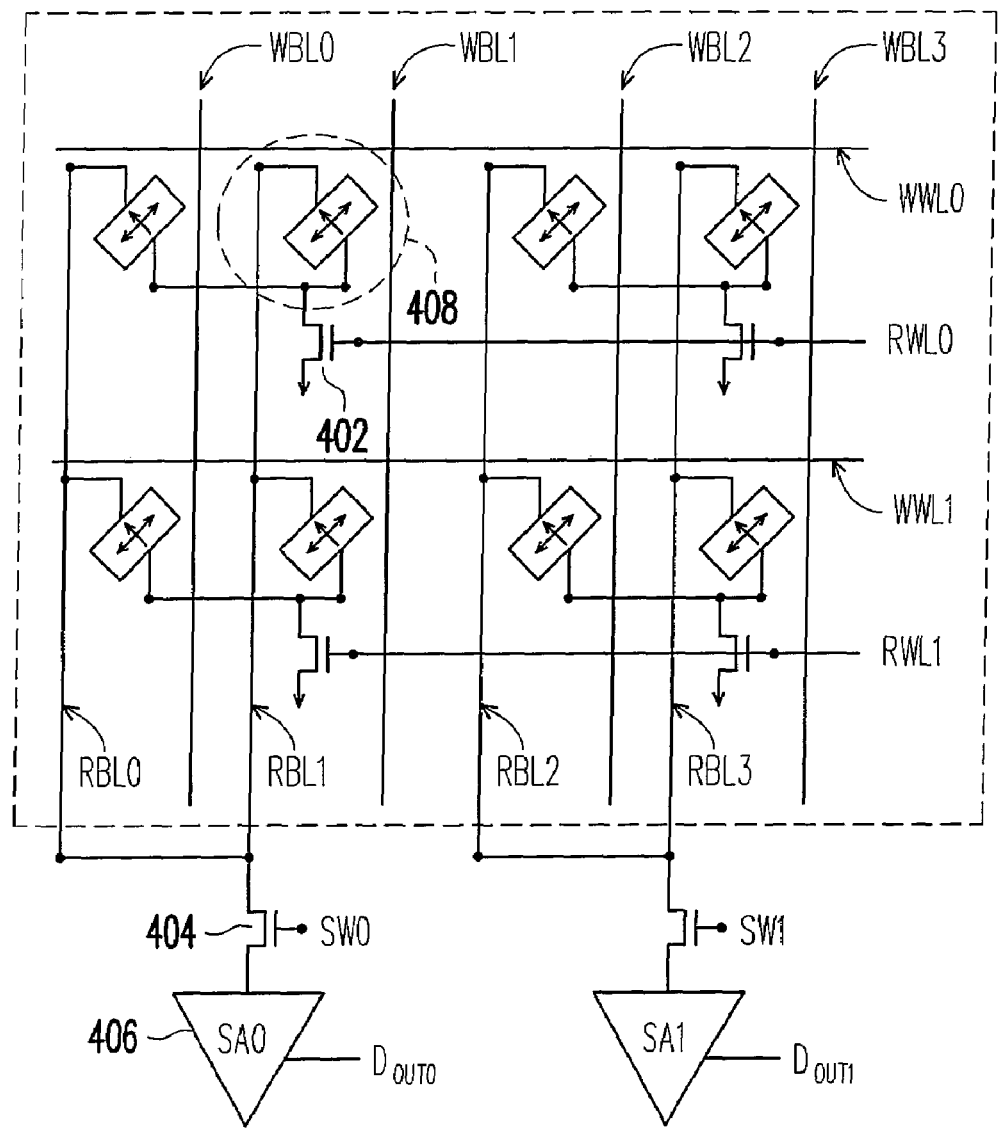

FIG. 9 schematically illustrates a matrix diagram of a magnetic random access memory according to an embodiment of the present invention.

Figure 10:
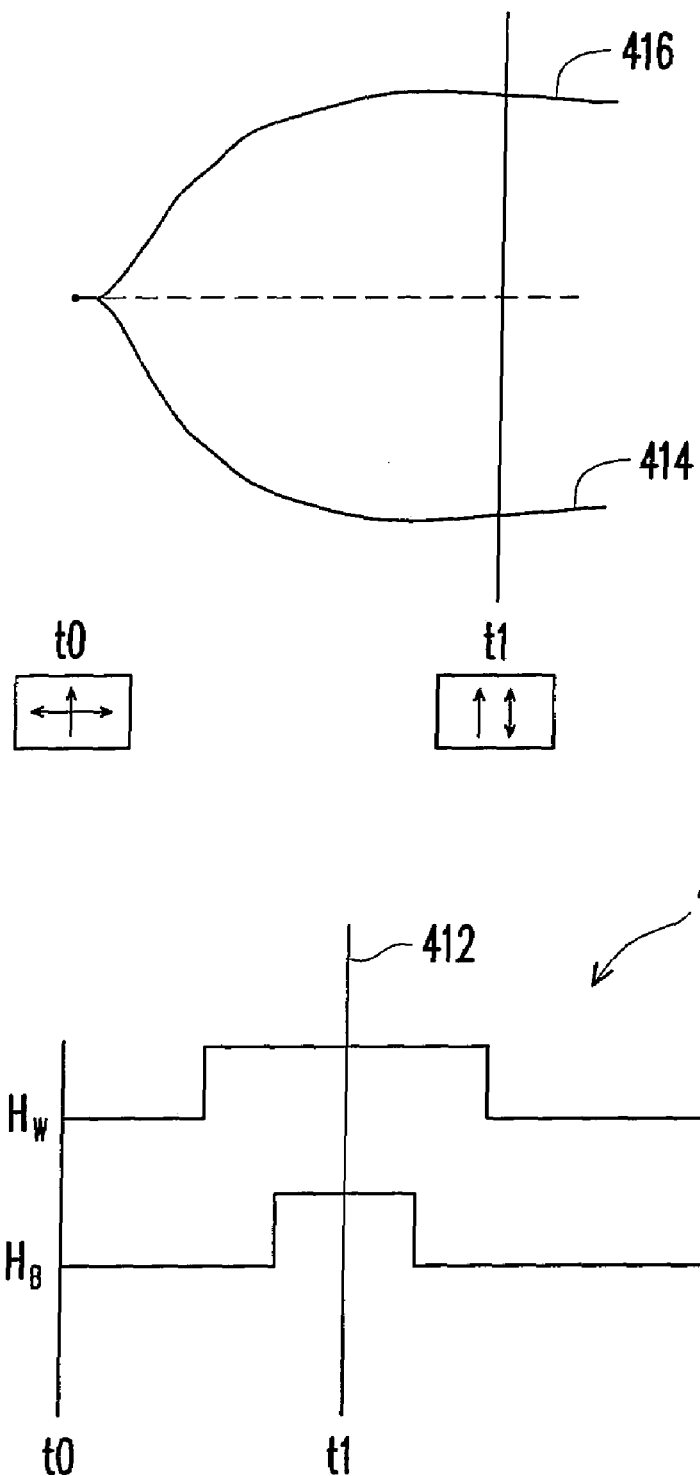

FIG. 10 schematically illustrates diagram of an operation mechanism used in an embodiment of the present invention.

Figure 11:
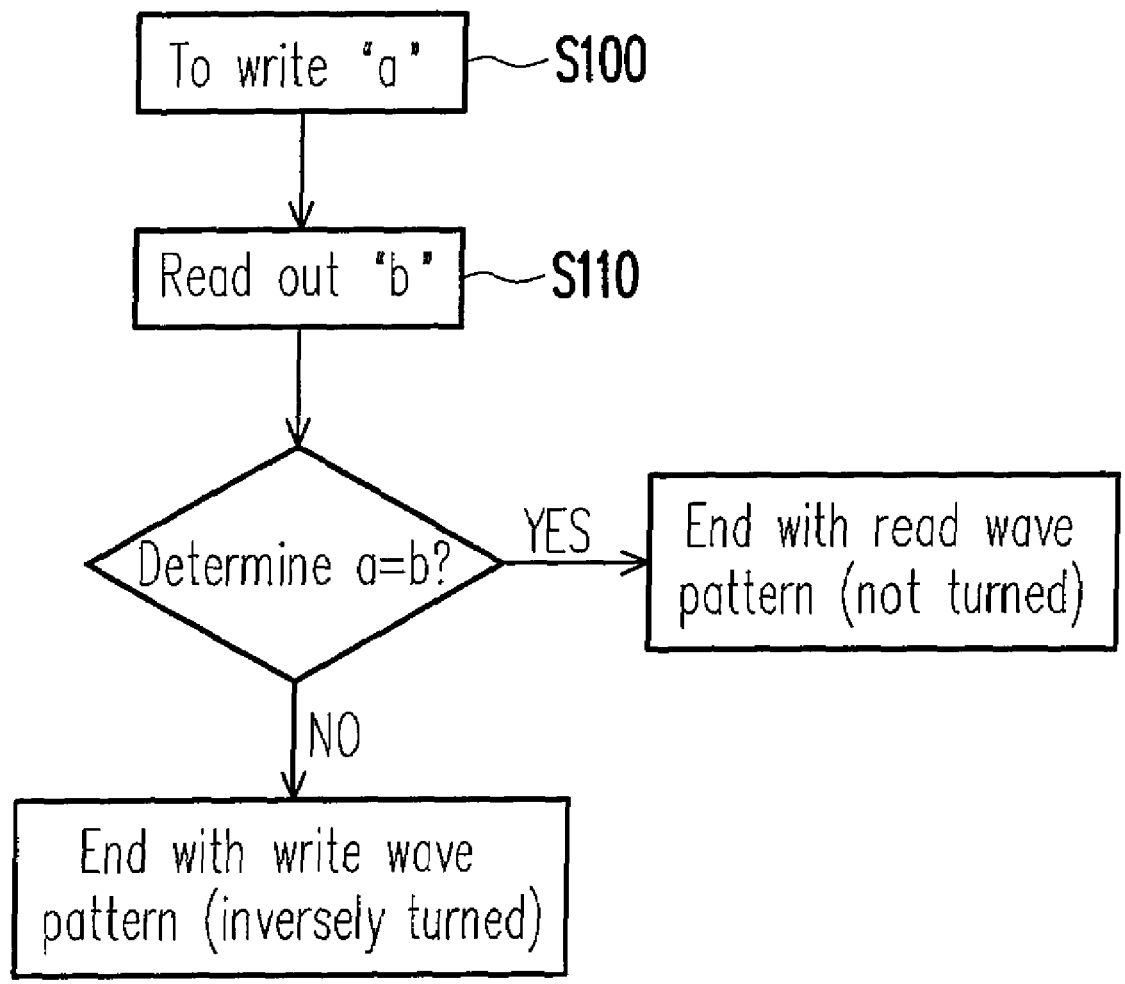

FIG. 11 schematically illustrates a diagram of write operation flow according to an embodiment of the present invention.

Figure 12:
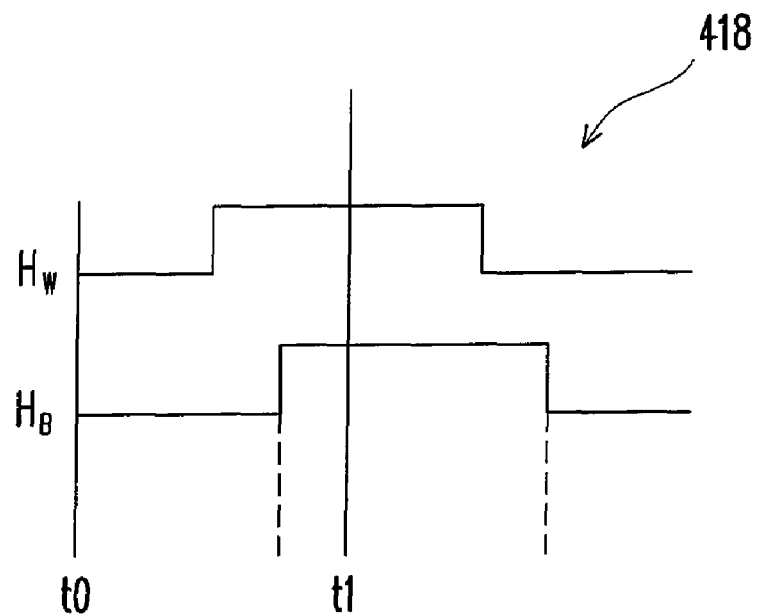

FIG. 12 schematically illustrates a diagram of an operation waveform 418 which is to change the data stored in the memory cell according to an embodiment of the present invention.

Figure 13:
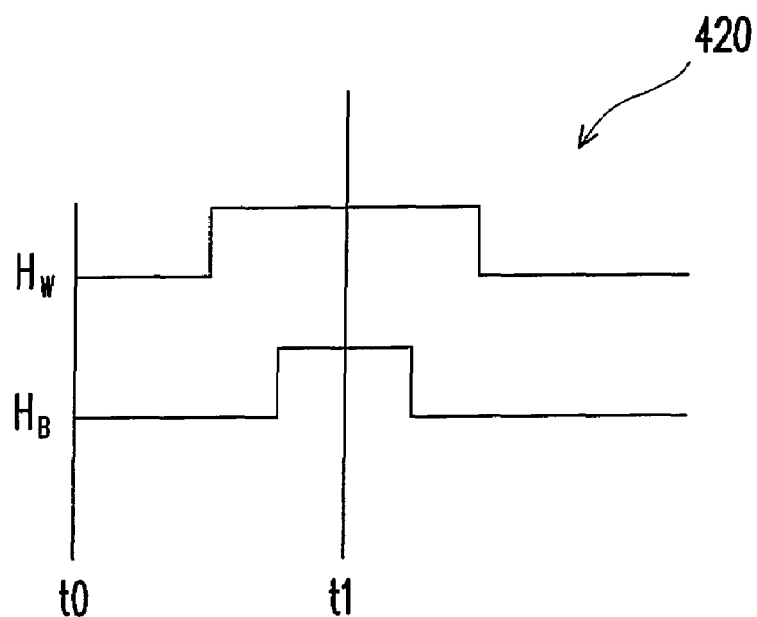

FIG. 13 schematically illustrates a diagram of an operation waveform 420 which is not to change the data stored in the memory cell according to an embodiment of the present invention.

DESCRIPTION OF EMBODIMENTS

In order to increase operation speed more effectively, the invention has provided another wiggle cell memory element structure. FIG. 3 schematically illustrates a diagram of a magnetic memory cell structure used according to an embodiment of the present invention. With reference to FIG. 3, only a portion of basic structure of the magnetic memory cell structure 190 is illustrated, wherein a magnetic pinned layer 210 includes a bottom pinned layer 192, having a magnetization 208. In addition, a top pinned layer 196, having a magnetization 206. There is a magnetic coupling spacer layer 194 between the bottom pinned layer 192 and the top pinned layer 196 for separation. The magnetizations 208, 206 of the bottom pinned layer 192 and the top pinned layer 196 have sufficient magnetic coupling strength, therefore the direction of magnetization will not be altered by external magnetic field. In addition, a magnetic free layer 216 is located above the magnetic pinned layer 210; a tunneling barrier layer 198 is used to separate the two. The magnetic free layer 216 includes a magnetic bottom free layer 200 and a magnetic top free layer 204. The bottom free layer 200 and the top free layer 204 respectively have a magnetization 212 and a magnetization 214, and are separated by the magnetic coupling spacer layer 202. The magnetization 212 and the magnetization 214 are anti-parallel to each other, but are perpendicular to the magnetizations 208, 206 of the magnetic pinned layer 210. Herein, in a general case and in the case that there is no external magnetic field available, the directions of the magnetizations 212, 214 are the same as the direction of an easy axis of magnetic material. In other words, in a natural situation without external magnetic field applied, the magnetization direction of the magnetic pinned layer 210 is perpendicular to the magnetization direction of the magnetic free layer 216. Therefore, the magnetoresistance values of the magnetization 212 and the magnetization 206 are substantially in a middle state, i.e. are between the magnetoresistance values of the parallel state and anti-parallel state, may be used as a reference magnetoresistance value state.

The read operation of the magnetic free layer 216, for example, depends on whether the direction of the magnetization 212 is towards left side or towards right side. When reading data, an appropriate external magnetic field is applied, for example the magnetization 212 of the magnetic free layer 216 is horizontally turned for 90 degrees. Viewing from a top view (not shown), for example turning 90 degrees in counter clock-wise, then the magnetization 212 is parallel to the magnetization 206. However, if the magnetization 212 is originally towards right, after being turned 90 degrees in counter clock-wise, then the magnetization 212 is anti-parallel to the magnetization 206. Therefore the data stored in the magnetic free layer 216 can be determined. In addition, in a natural situation, the magnetization direction of the magnetic pinned layer 210 is perpendicular to the magnetization direction of the magnetic free layer 216, therefore any other memory cell with no magnetic field applied is in middle state, and may be selected as a reference. FIG. 4 schematically shows a circuit structure using such reading method. An adjacent diagonal memory pair mutual referencing method is used to achieve the goal of fast memory access and stable signal.

FIG. 4 schematically illustrates a circuit diagram of a general wiggle cell magnetic access memory used in the art. With reference to FIG. 4, the magnetic memory circuit for example includes a plurality of magnetic memory cell structures 310-316 previously described to form a two-dimensional array with a plurality of memory columns and a plurality of memory rows. Taking the magnetic memory cell structure 310 as an example, for example the dual-head arrow 310a represents two possible directions of the magnetization of the free layer, while the single-head arrow, 310b represents the direction of the magnetization of the pinned layer. In a natural situation, the direction of magnetization of the free layer is virtually vertical to the direction of the magnetization of the pinned layer. In addition, a plurality of bit current lines BLi, BLj respectively corresponds to a plurality of memory columns configuration. A plurality of word current lines WWLi, WWLj respectively correspond to a plurality of memory rows configuration. A plurality of read circuit lines (or also called sense line) 318 may respectively read a magnetoresistance value of each of these memory cell structures. A driving circuit unit, for example includes a bit line driving unit 302 and a word line driving unit 304 for controlling the bit and word current lines, these bit/word current lines and these read circuit lines, so as to apply a plurality of operation magnetic fields needed for memory accessing to the selected memory cell structure, and to read a magnetoresistance value.

Since general magnetic memory uses 1T1MTJ memory structure, i.e. a memory cell has a switch transistor structure; the size of the element thereof is approximately 30 $F^2$-40 $F^2$. Although for replacing eSRAM (Embedded SRAM) product is easier, however, it is still difficult to replace the eDRAM (Embedded DRAM) which is widely used in the existing semi-conductive memory by system end.

At least according to such motivation, the present invention provides a circuit structure connecting to transistor through a plurality of wiggle magnetic cells connected in series or in parallel, which can significantly increase the integration density of magnetic memory, so as to reduce production cost of memory, and to accelerate the progress of replacing the existing semiconductor memory used in system.

The so called a plurality of wiggle magnetic cells connected in parallel or in series for example is in term of circuit with two parallel connected memory cells. FIG. 5 schematically illustrates a diagram of the parallel connected circuit and memory mechanism used in the previous case. With reference to FIG. 5, the adjacent two memory cells 350, 352 on a read bit line have magnetoresistance R1 and R2 with different values; the other ends thereof are connected to a switch transistor 354 together. The gate of the transistor 354 for example is controlled by word line to be on or off. When it is ON, a ground voltage can be connected to form a closed circuit, so as to read the total magnetoresistance of the magnetoresistance R1 and R2. Since states of the free layer and pinned layer of memory cell have parallel state and antiparallel state, $R_{1max}$, $R_{1min}$, $R_{2max}$, $R_{2min}$ are respectively generated. Therefore for example four two-bit data 11, 10, 01, 00 are formed. Of course the parallel connected circuit may also have four magnetoresistance states which can be differentiated. Such circuit can reduce the fabrication of transistors, and equivalently reduce bit size. A plurality of the wiggle magnetic memory cells of an embodiment of the present invention connected in series or in parallel, use the wiggle magnetic memory cells as shown in FIG. 3. The magnetoresistances R1 and R2 of the same size are used (i.e. 350 and 352 use the same element), thus also have the effect of reducing bit size.

FIG. 6 schematically illustrates a circuit diagram of a magnetic random access memory unit according to an embodiment of the present invention. With reference to FIG. 6, the magnetic memory cell for example uses the wiggle memory cell as shown in FIG. 3. Therefore, as previously described, the directions of double-head arrow represent the easy axis directions of the free layer, which are the directions of the two magnetizations of the free ferromagnetic layer under a natural situation, and is substantially perpendicular to the magnetizations of the pinned layer. To operate in the low writing interference mode, the easy axis direction of the free layer substantially forms an including angle of about 45 degrees angle with the write word line WWL0 or the write bit line WBL. The circuit of FIG. 6 is a memory unit formed with a plurality of memory cells 400 connected in parallel. Herein, the write word line and write bit line are two perpendicular current lines with extending directions, and are not limited to the descriptive nouns "word" and "bit". Magnetic field is generated when current is passed to the current line in an operation time sequence. The memory cell 400 is located at the intersection regions of two current lines, and the two magnetizations of the free layer thereof may turn correspondingly when magnetic field direction is sensed. Thus the stored data can be changed.

In the present embodiment, for the read circuit, for example an electrode layer of the memory cell is connected to a ground voltage via the switch transistor 402. The gate of the transistor 402 for example uses the read word line to input control signal to turn on or turn off. In addition, another electrode layer of memory cell for example is respectively connected to another switch transistor 404 together through the read bit line. When the switch transistor 404 is a close circuit, the memory cell 400 may be connected to the sense amplifier (SA) 406 to sense the parallel connected total magnetoresistance. Since each memory cell 400 is designated with two states in magnetoresistance Rmax, Rmin, therefore stores data of a plurality of bits, but shares one memory unit, only uses one transistor 404 to connect to the sense amplifier 406, and another transistor 402 to connect to ground voltage.

Basing on the change of circuit of parallel connection, FIG. 7 schematically illustrates a circuit diagram of a magnetic random access memory unit according to another embodiment of the present invention. With reference to FIG. 7, the memory cell 400 may also be connected together through an internal line first, then be connected to the sense amplifier 406 through a read bit line, for example RBL0. That is, the circuit of the read bit line-and read word may vary with actual design, as long as they are parallel circuits of.

FIG. 8 schematically illustrates a diagram of a series circuit of a magnetic random access memory unit according to an embodiment of the present invention. With reference to FIG. 8, the previous FIG. 6-7 are parallel circuits, and however may also be changed to series connection, and the stored data of a plurality of bits is also determined according to the total magnetoresistance of the memory unit. For example, a plurality of memory cells 400 are connected in series, thus, the switch transistor 402 is connected to a memory cell 400 of an end. The switch transistor 404 for example is connected to a memory cell 400 of another end through a read bit circuit. Thus, a plurality of memory cells 400 form a memory unit in form of series connection.

In a further design, a plurality of memory units may form a memory cell matrix to become a magnetic random access memory. FIG. 9 schematically illustrates a matrix diagram of a magnetic random access memory according to an embodiment of the present invention. With reference to FIG. 9, for example taking the memory unit of FIG. 6 and the embodiment of a unit with two memory cells as examples, only a portion of the matrix is illustrated, depending on the expected storage capacity.

The magnetic random access memory circuit includes a plurality of first-direction write current lines WWL0, WWL1 . . . , and a plurality of second-direction write current lines WBL0, WBL1, WBL2, WBL3 . . . , which substantially perpendicularly intersect with these first-direction write current lines WWL0, WWL1 . . . to form a plurality of intersection regions. A plurality of magnetic memory cells are respectively located at the intersection regions. The easy axis of the free layer of each magnetic memory cell is substantially perpendicular to the magnetization of the pinned layer thereof, and there is about 45 degree for the including angle between the easy axis and the first-direction write current line. The adjacent every at least two of these magnetic memory cells, which are driven by the same first-direction write current line, are a memory unit to form a plurality of memory rows. The circuit further includes a plurality of first switches 404, and a plurality of sense amplifiers 406, which are respectively connected to the memory unit of the memory column via the first switches 404. In addition, a plurality of the second switches 402 respectively connects the memory unit to a ground potential.

For example, the memory cell 408 may be respectively selected and operated through the write word line WWL0 and the write bit line WBL1. The read circuit also connects the same numbers of sense amplifiers (SA0, SA1 . . . ) 406 and switch transistors (SW0, SW1 . . . ) 404 according to the number of memory columns. FIG. 9 is an array formed only basing on the structure of FIG. 6. However for the other methods, for example, the parallel circuit of FIG. 7 or the series circuit of FIG. 8 may also form an array to have large capacity memory.

An operation waveform is described below. According to the structure of FIG. 9, for example the write word lines WWL0, WWL1 . . . are at horizontal X axis direction, and for example are on top of the memory cell, so as to generate a magnetic field of positive Y axis direction. The write bit lines WBL0, WBL1 . . . are at perpendicular Y axis direction, and for example are at the bottom of the memory cell, so as to generate a magnetic field of positive X axis direction. FIG. 10 schematically illustrates diagram of an operation mechanism used in an embodiment of the present invention. With reference to FIG. 10, the magnetic field waveform 410 at the bottom is described using the structure of FIG. 9 as an example. The two magnetizations of the free layer of the memory cell are denoted with double-head arrow, and the magnetization of the pinned layer is denoted with single-head arrow. At the time point of t0, the memory cell is in natural state without magnetic fields $H_W$ and $H_B$, the two magnetizations of the free layer are substantially perpendicular to the magnetization of the pinned layer. virtually vertical to each other.

To read data of the memory cell, the two magnetizations of the free layer need to be turned for 90 degrees to read the resistance generated by the magnetization for a configuration of including angle with the pinned layer, so as to determine whether it is the anti-parallel state 416 or the parallel state 414. Similar to the operation of the toggle mode, for example, the magnetic field $H_W$ is first activated to turn 45 degrees, then the magnetic field $H_B$ is activated to further turn 45 degrees. Turning about 90 degrees is accomplished by the two steps. At the time point 412 of t1, since the magnetization of the free layer is turned for 90 degrees, the parallel state or the anti-parallel to the magnetization of the pinned layer represents different memory value. Each memory cell of the memory unit is in parallel state or anti-parallel state at this t1 time point. Therefore the total magnetoresistance value is read through controlling the switch transistor and the connected read word line, read bit line. After comparing the total magnetoresistance value with a reference value, the data in multi-bit memory can be obtained.

After reading, the turned magnetization of the free layer needs to be turned back to the original state. Therefore the magnetic field $H_B$ needs to be stopped first, and then the magnetic field $H_W$ is stopped.

To write data to memory cell, the write operation method thereof is different from the read operation method. FIG. 11 schematically illustrates a diagram of write operation flow according to an embodiment of the present invention. FIG. 12 schematically illustrates a diagram of an operation waveform 418 to change the data stored in the memory cell according to an embodiment of the present invention. FIG. 13 schematically illustrates a diagram of an operation waveform 420 not to change the data stored in the memory cell according to an embodiment of the present invention. The beginning stages of operation in FIG. 12 and FIG. 13 are the same, but the latter stages are different. With reference to FIG. 11, in step S100, it is determined to write "a" to a memory cell of a memory unit. In step S110, the forepart reading operation according to the time points t0 and t1 of FIG. 12 or FIG. 13, at the time point t1, the data currently stored is read out as "b", wherein step S100 and step S110 can be carried out concurrently or reversely. Therefore, it needs to determine if a=b. If a=b, then end with read waveform, which is waveform 420. The magnetization thereof is not inverted, the same as read operation. On the contrary, if a≠b, then end with waveform 418, and the magnetization thereof is inverted. Waveform 418 is after the time point t1, the magnetic field $H_W$ is stopped first, and then the magnetic field $H_B$ is stopped. That is, the magnetization of the free layer is continuously turned for 90 degrees to achieve the result of inversion, the stored data is therefore changed.

The operation waveform described above is basic waveform. If necessary, a negative magnetic field may also be applied in advance to ensure the operation accuracy. In addition, a conventional design of applying a magnetic bias field to reduce write current may also be used. Moreover, the above waveform is to turn the magnetization of the free layer in clock-wise. To turn the magnetization of the free layer counter clock-wise, it can be done through changing the applying direction of the current, so as to operate with the third stage of the negative magnetic fields ($-H_W$, $-H_B$), the mechanism thereof is still the same.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed:

1. A magnetic random access memory, comprising:
   at lease a first-direction write current line;
   a plurality of second-direction write current lines, substantially perpendicularly intersecting with the first-direction write current line, forming a plurality of intersection regions;
   a plurality of magnetic memory cells, respectively located at the intersection regions, receiving an induced magnetic field in a time sequence, wherein the adjacent at least every two magnetic memory cells are connected in series or parallel, to form at least a memory unit, wherein an easy axis of a free layer of each of the magnetic memory cells is substantially perpendicular to a magnetization of a pinned layer, and an including angle of about 45 degrees is between the easy axis and the first-direction write current line;
   a read bit line circuit, connected to a first terminal of the memory unit; and
   a read word line circuit, connected to a second terminal of the memory unit.

2. The magnetic random access memory of claim 1, wherein the read bit line circuit further comprises a switch, connected to the first terminal to output a total magnetoresistance of the memory unit.

3. The magnetic random access memory of claim 1, wherein the read word line circuit further comprises a switch, connecting the second terminal to a ground voltage.

4. The magnetic random access memory of claim 1, wherein the first terminal of the memory unit is coupled to an external sense amplifier through the read bit line circuit, and the second terminal is coupled to a ground voltage through the read word line.

5. The magnetic random access memory of claim 1, wherein each of the memory cells of the memory unit respectively has a parallel state magnetoresistance and an anti-parallel state magnetoresistance to form the memory unit in multi-bit.

6. The magnetic random access memory of claim 1, wherein the memory cells of the memory unit are connected in parallel, and the read bit line circuits have a plurality of read bit lines respectively connected between an electrode layer and the first terminal of the memory cells.

7. The magnetic random access memory of claim 1, wherein the memory cells of the memory unit are connected in parallel, and have a corresponding read bit line and a share line, wherein the share line is used to commonly connect to a plurality of electrode layers of the memory cells; the read bit line is connected between the share line and the first terminal.

8. The magnetic random access memory of claim 1, wherein the memory cells of the memory unit are connected in series.

9. The magnetic random access memory of claim 1, wherein each of the write word lines has a row of the memory cells, every two of the memory cells form the memory unit, connected to a ground voltage and a sense amplifier through two switches.

10. The magnetic random access memory of claim 1, wherein the free layer of each of the magnetic memory cells is a synthetic antiferromagnetic structure, comprising:
    a first ferromagnetic layer, having a first free magnetization;
    a second ferromagnetic layer, having a second free magnetization, coupled with the first free magnetization in a way of anti-parallel; and
    a coupling layer, between the first ferromagnetic layer and the second ferromagnetic layer.

11. The magnetic random access memory of claim 10, wherein after the first free magnetization and the second free magnetization of the memory cells are turned for 90 degrees according to an operation turning direction, an anti-parallel maximum magnetoresistance or a parallel minimum magnetoresistance is generated with the magnetization of the pinned layer, which is used to store a data of a bit.

12. An operation method of magnetic random access memory, used to operate the magnetic random access memory of claim 1, comprising:
    applying a first current to the first-direction write current line to generate the induced magnetic field of a first stage;
    further applying a second current to the second-direction write current line to generate the induced magnetic field of a second stage; and
    reading a total magnetoresistance of the memory unit to determine a data stored in the memory unit.

13. The operation method of the magnetic random access memory of claim 12, comprising:
    if the data stored in the memory unit not changed, then sequentially performing the following steps:
        stopping applying the second current to the second-direction write current line; and
        stopping applying the first current to the first-direction write current line.

14. The operation method of the magnetic random access memory of claim 12, further comprising:
    when to change the data stored in the memory unit, determining the memory cell of the data to be changed or the memory cell of the data not to be changed;
    for the memory cell of the data not changed, after reading the total magnetoresistance of the memory unit, then performing the following steps in time sequence:
        stopping applying the second current to the second-direction write current line; and
        stopping applying the first current to the first-direction write current line; and
    for the memory cell of the data to be changed, after reading the total magnetoresistance of the memory unit, then performing the following in time sequence:
        stopping applying the first current to the first-direction write current line; and
        stopping applying the second current to the second-direction write current line.

15. The operation method of the magnetic random access memory of claim 12, wherein applying the first current to the first-direction write current line generates a magnetic field of positive Y axis direction; while applying the second current to the second-direction write current line generates a magnetic field of positive X axis direction.

16. A magnetic random access memory circuit, comprising:
    a plurality of first-direction write current lines;
    a plurality of second-direction write current lines, substantially perpendicularly intersecting with the first-direction write current lines, forming a plurality of intersection regions;
    a plurality of magnetic memory cells, respectively located at the intersection regions, wherein an easy axis of a free layer of each of the magnetic memory cells substantially being perpendicular to a magnetization of a pinned layer, and an about 45 degrees is for an including angle between the easy axis and the first-direction write current line; wherein the adjacent at least every two of the magnetic memory cells which are driven by the same first-direction write current line are a memory unit, to form a plurality of memory rows;
    a plurality of first switches;
    a plurality of sense amplifiers, respectively connected to the memory units of the memory columns via the first switches; and
    a plurality of second switches, respectively connecting the memory units to a ground potential.

17. The magnetic random access memory circuit of claim 16, wherein the memory cells of the memory unit are connected between the corresponding first switch and the ground potential in parallel.

18. The magnetic random access memory circuit of claim 16, wherein the memory cells of the memory unit are connected to the corresponding first switch and the ground potential in series.

19. The magnetic random access memory circuit of claim 16, wherein each of the sense amplifiers is used to sense a total magnetoresistance of the selected memory unit to determine the data stored by the memory unit.

20. The magnetic random access memory circuit of claim 16, wherein the first-direction write current line and the second-direction write current line are used to apply to the selected memory cell, to turn a direction of a pair of magnetizations which are about anti-parallel in the free layer.

* * * * *